United States Patent
Luo et al.

(10) Patent No.: US 7,086,144 B2
(45) Date of Patent: Aug. 8, 2006

(54) CPU MOUNTING APPARATUS

(75) Inventors: Yong-Min Luo, Shenzhen (CN); Wen-Shan Xu, Shenzhen (CN)

(73) Assignee: HON HAI Precision Industry Co., Ltd., Tu-Cheng (TW)

( * ) Notice: Subject to any disclaimer, the term of this patent is extended or adjusted under 35 U.S.C. 154(b) by 0 days.

(21) Appl. No.: 10/989,700

(22) Filed: Nov. 16, 2004

(65) Prior Publication Data

US 2005/0233615 A1 Oct. 20, 2005

(30) Foreign Application Priority Data

Apr. 17, 2004 (CN) .................. 2004 2 0045005

(51) Int. Cl.
*H05K 13/04* (2006.01)

(52) U.S. Cl. ........................ 29/741; 439/940

(58) Field of Classification Search ................ 439/526, 439/940; 29/741, 758, 764

See application file for complete search history.

(56) References Cited

U.S. PATENT DOCUMENTS

| | | | | |
|---|---|---|---|---|
| 4,392,301 A | * | 7/1983 | Hannes et al. ................ 29/741 |
| 4,616,414 A | * | 10/1986 | Cushman .................... 29/835 |
| 4,723,361 A | * | 2/1988 | Carlson et al. ............... 29/764 |
| 4,868,975 A | * | 9/1989 | Zaremba et al. ............. 29/741 |
| 5,784,774 A | * | 7/1998 | Kajiwara .................... 29/758 |
| 6,724,206 B1 | * | 4/2004 | Arakawa et al. ............ 324/755 |

FOREIGN PATENT DOCUMENTS

| | | | |
|---|---|---|---|
| EP | 257327 | * | 7/1987 |
| TW | 476503 | | 2/1991 |

* cited by examiner

*Primary Examiner*—Neil Abrams
(74) *Attorney, Agent, or Firm*—Tim Tingkang Xia, Esq.; Morris Manning & Marti

(57) ABSTRACT

A mounting apparatus for mounting a CPU (53) in a socket (52), includes a base (20), a plurality of resilient members (300) respectively disposed at opposite sides of the base and a movement unit (40) having a pressing portion (402) received in the base which moves vertically with respect to the base. The base includes a concave (201) defined in a bottom thereof for receiving the CPU therein. The resilient members cooperate with each other to locate the CPU within the base. The pressing portion is provided to push the CPU off the base so as to vertically mount the CPU into the socket. The base includes projection portions (221, 233) to be received in slots (521, 523) in the socket.

15 Claims, 6 Drawing Sheets

CPU MOUNTING APPARATUS

BACKGROUND OF THE INVENTION

1. Field of the Invention

The present invention relates to mounting apparatus for CPUs, and particularly to a mounting apparatus for readily and securely installing or removing a CPU to or from a socket.

2. Description of the Prior Art

Conventionally, a central processing unit (CPU) is inserted into a socket connector directly. Referring to FIGS. 5 and 6, a socket 12 of Intel Pentium 5 CPU is mounted on a motherboard 1. The socket 12 comprises a plurality of pins 120 and two slots 121, 123 in two sides thereof for readily mounting the CPU 13. The CPU 13 has a plurality of pads 130 corresponding to the pins 120 of the socket 12. During installation, the CPU 13 is inserted into the socket 12 straightly. The CPU pads 130 engage with the mating socket pins 120. However, some of the pins 120 are often damaged or bent when too much force is applied thereon or the force is inequality during forced manipulation. The damaged or bent pins can not connect with the pads 130 whereby a loose electrical connection is arisen. Moreover, it is rather inconvenient and laborious to insert the CPU into the socket by handwork.

Thus, an improved mounting apparatus for a CPU which overcomes the above-mentioned problems is desired.

BRIEF SUMMARY OF THE INVENTION

Accordingly, an object of the present invention is to provide a mounting apparatus which readily and securely attaches or removes a CPU to or from a socket.

To achieve the above-mentioned objects, a mounting apparatus in accordance with a preferred embodiment of the present invention is used to mount a CPU in a socket, includes a base, a plurality of resilient members respectively disposed at opposite sides of the base and a movement unit having a pressing portion received in the base which moves vertically with respect to the base. The base includes a concave defined in a bottom thereof for receiving the CPU therein. The resilient members cooperate with each other to locate the CPU within the base. The pressing portion is provided to push the CPU off the base so as to mount the CPU into the socket.

In this invention, the CPU is secured to the socket with the mounting apparatus. The mounting apparatus with the CPU is inserted into the socket vertically, so avoid destroy of the pins by the manual operation.

Other objects, advantages and novel features of the present invention will become more apparent from the following detailed description when taken in conjunction with the accompanying drawings, in which:

DETAILED DESCRIPTION OF THE INVENTION

Figure 1:
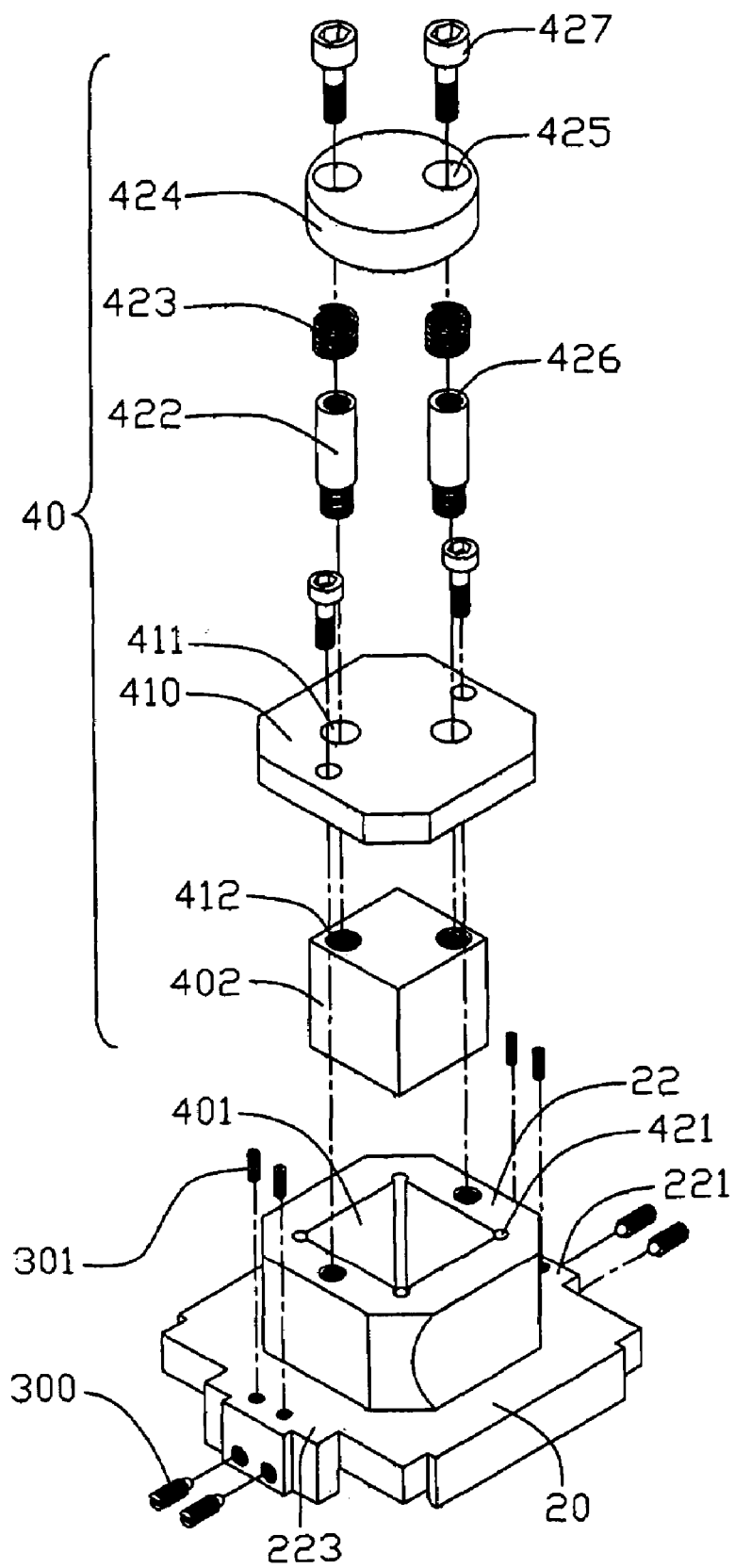
FIG. 1 is an exploded, isometric view of a mounting apparatus in accordance with the present invention.
Figure 2:
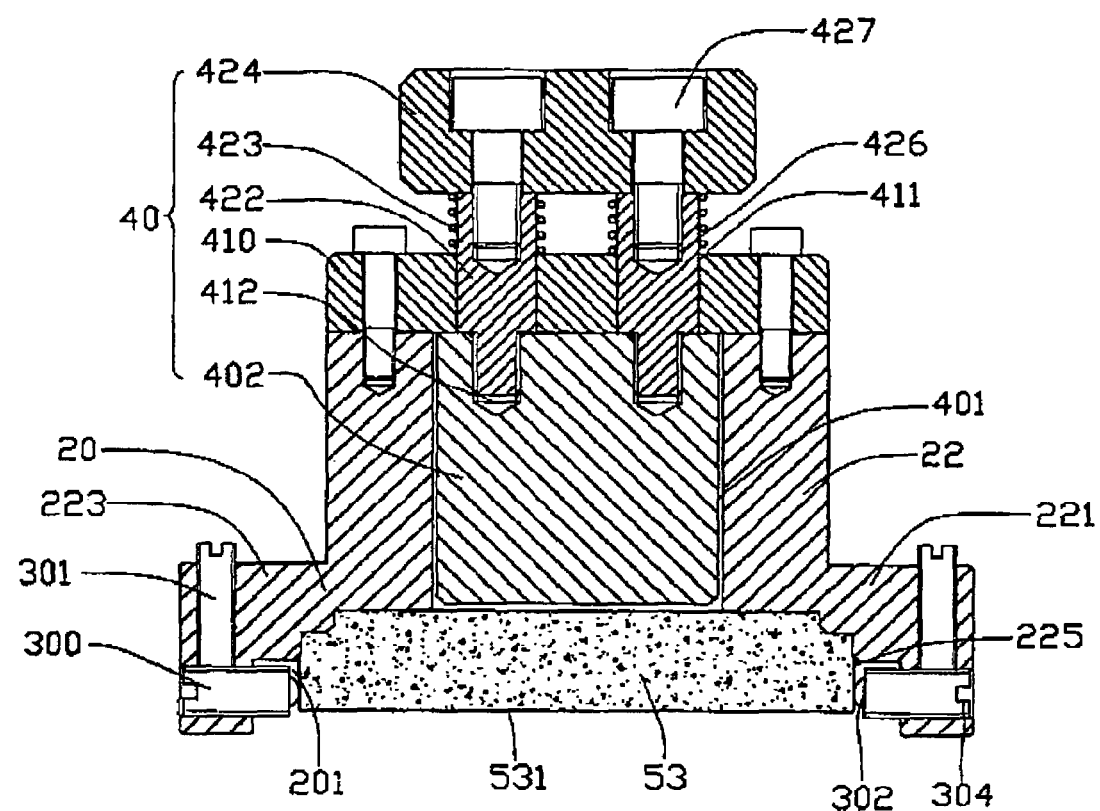
FIG. 2 is a cross-sectional assembled view of the mounting apparatus of FIG. 1, together with a CPU.
Figure 3:
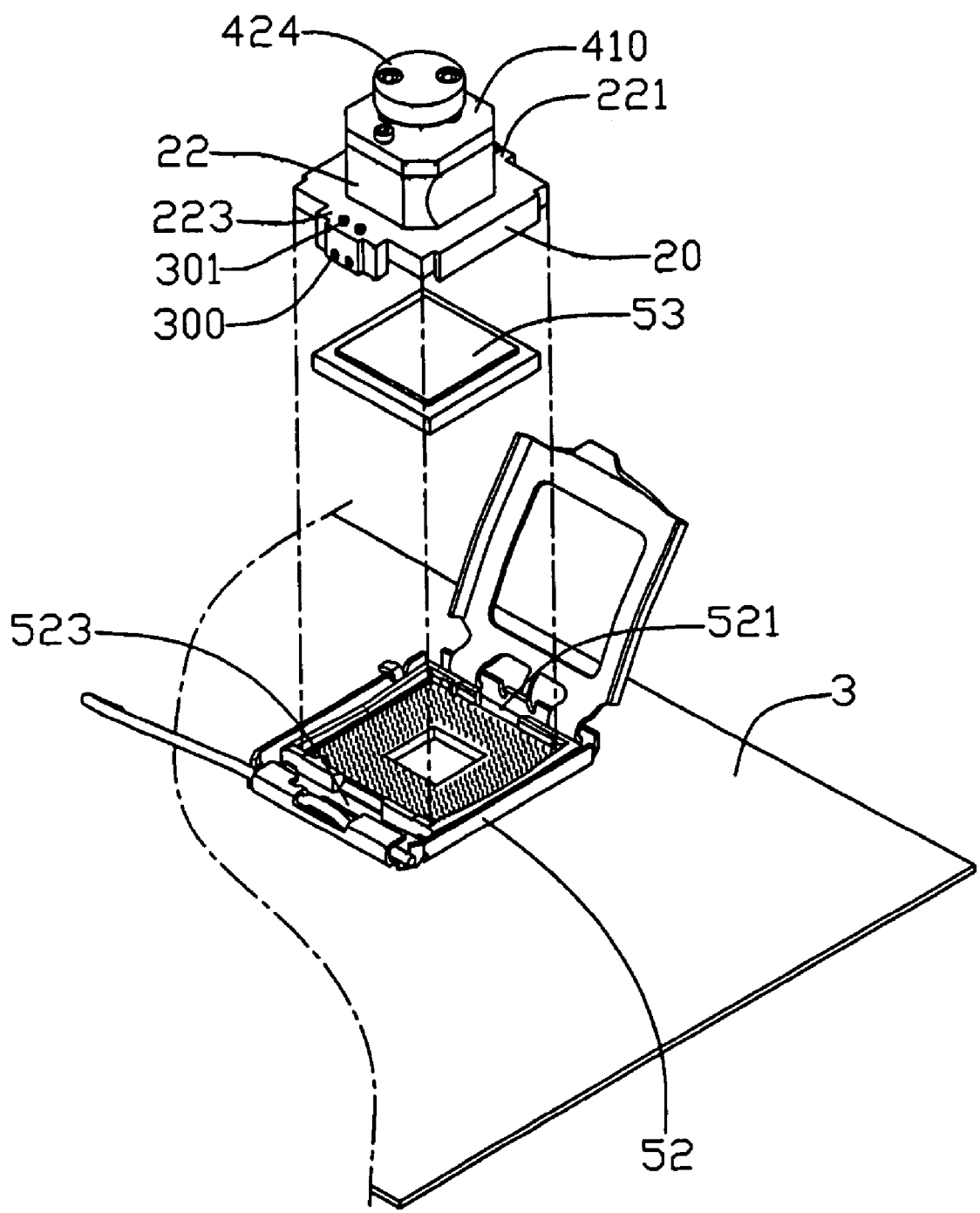
FIG. 3 is an exploded, isometric view showing an assembled mounting apparatus of FIG. 1, together with a CPU and a socket mounted on a motherboard.

Referring to FIGS. 1–3, a CPU mounting apparatus in accordance with a preferred embodiment of the present invention is shown for mounting a CPU 53 to a socket 52 on a motherboard 3. The CPU 53 forms a plurality of aligned pads 531 at a bottom surface thereof. The socket 52 forms a plurality of aligned pins 120 corresponding to the pads 531. The CPU mounting apparatus comprises a base 20, a plurality of resilient members 300, and a movement unit 40.

The base 20 has a concave 201 in a bottom thereof to accommodate the CPU 53 therein. A first projecting portion 221 and a second projecting portion 223 are formed outwardly from two opposite sides of the base 20 respectively. A bulge 22 extends upwardly from the base 20. A through hole 401 is defined in the bulge 22 and communicates with the concave 201.

The bottom of the base 20 can be snugly received in the socket 52 on the motherboard 3, as shown in FIG. 3. The concave 201 has a step corresponding to a stepped top of the CPU 53 to accommodate the CPU 53 tightly. The projecting portions 221, 223 can be inserted into slots 521, 523 of the socket 52 respectively to ensure the CPU 53 being vertical with the socket 52, and the pads 531 of the CPU 53 are respectively in alignment with the pins 120 of the socket 52. The outer surface of the bulge 22 is arc shaped for facilitating manual operation.

The movement unit 40 comprises an operating portion 424, a pressing portion 402, a pair of connecting posts 422 for connecting the pressing portion 402 and the operation portion 424, and a cover 410 fastened to the bulge 22. Each of the connecting posts 422 has screw threads in one end thereof and a screw hole 426 in the other end. The pressing portion 402 defines a pair of screw holes 412 therein corresponding to the screw threads of the connecting posts 422. The pressing portion 402 is received in a central through hole 401 of the bulge 22. The cover 410 defines a pair of through holes 411 aligning with the screw holes 412 of the pressing portion 402 for the connecting posts 422 extending therethrough and moving vertically therein.

Figure 4:
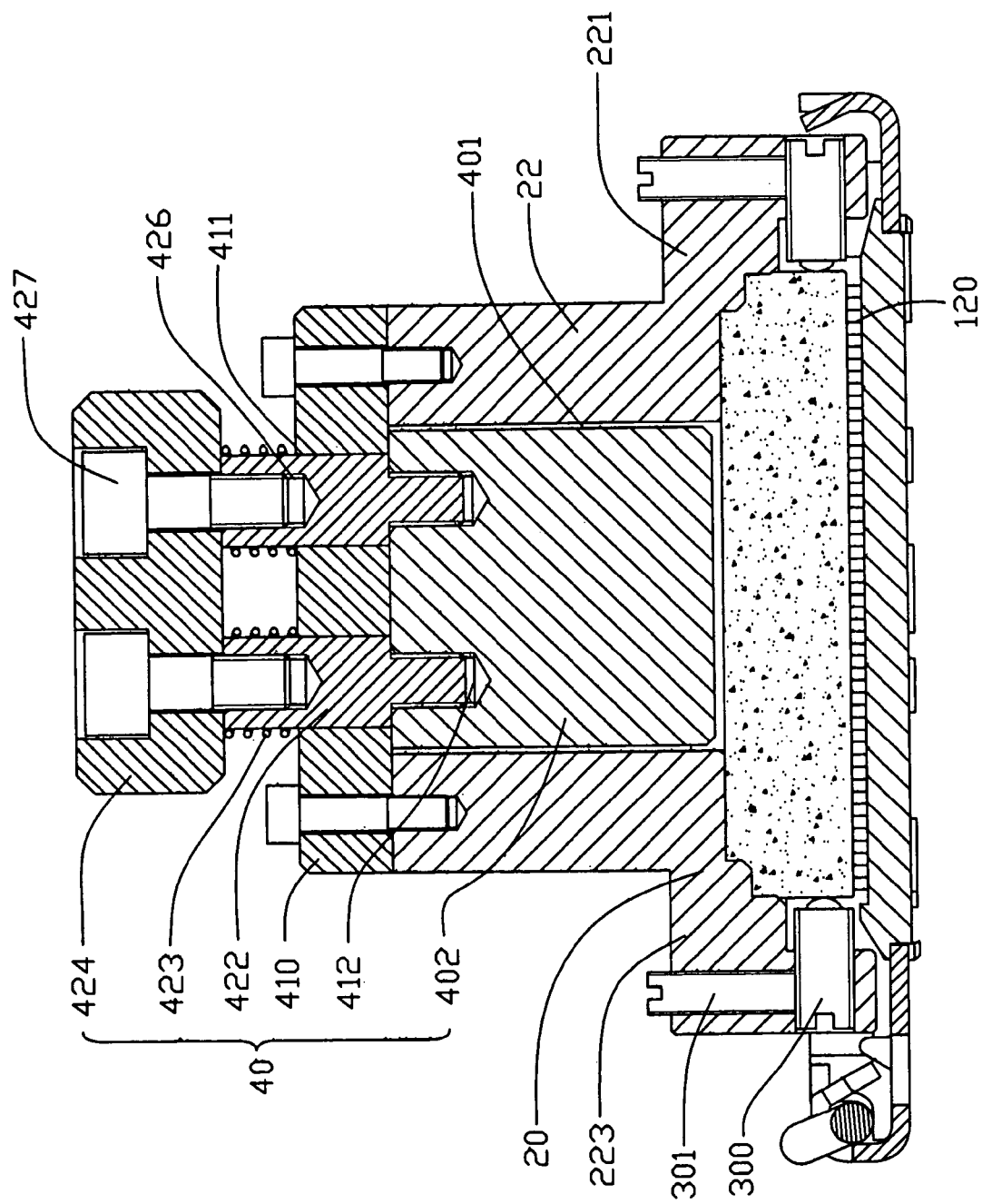
FIG. 4 is a cross-sectional and assembled view of FIG. 3.
Figure 5:
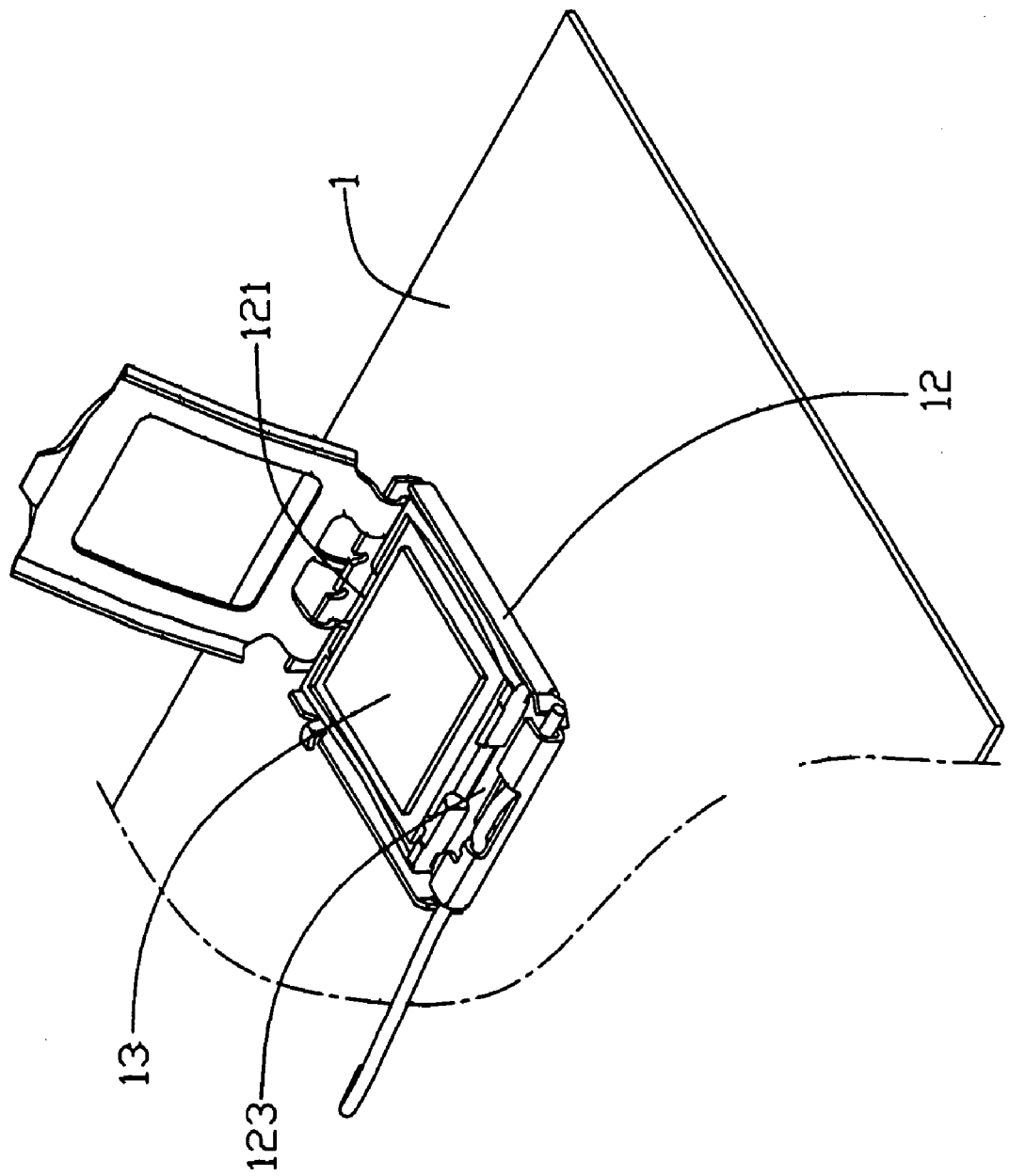
FIG. 5 is an illustration showing a conventional CPU is installed in a socket on a motherboard.
Figure 6:
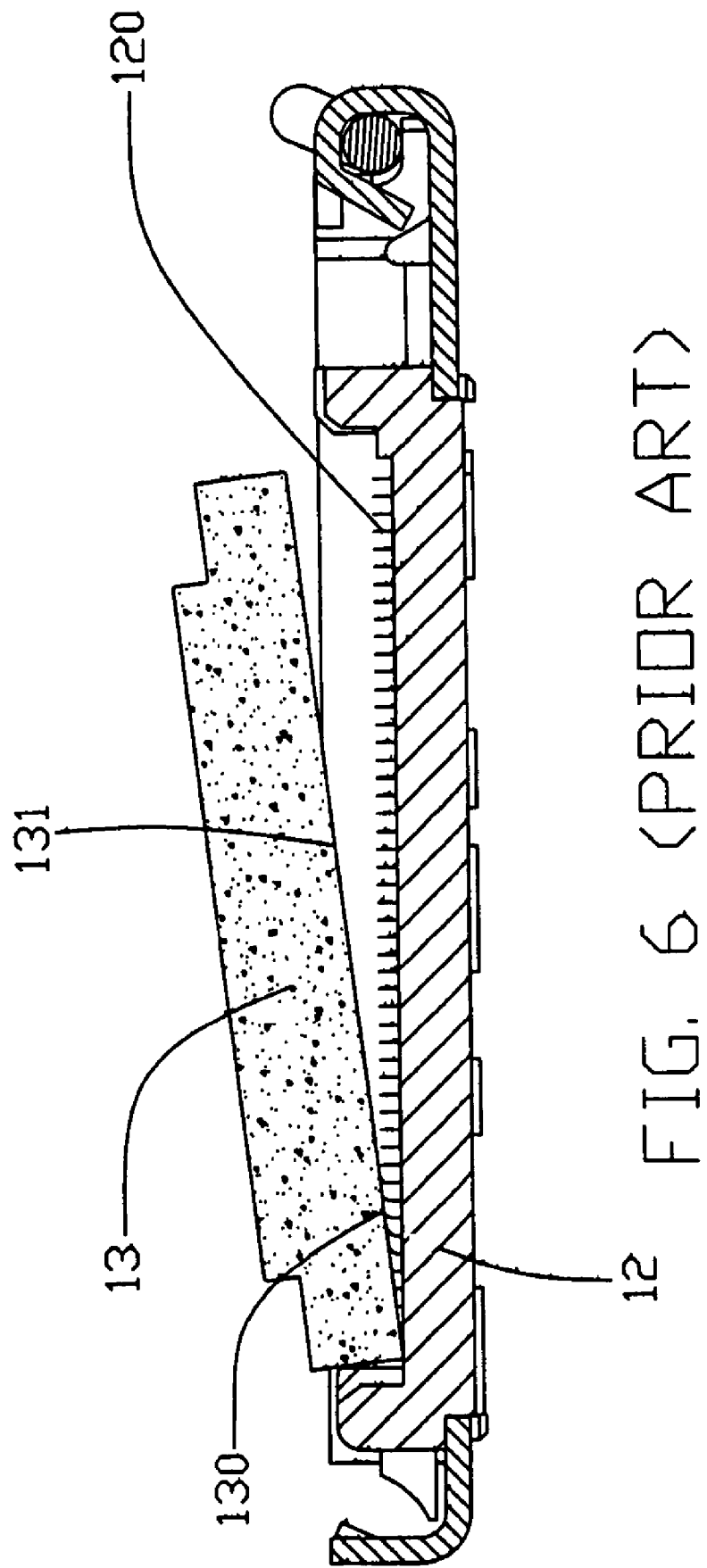
FIG. 6 is a cross-sectional view showing a conventional manual insertion of the CPU of FIG. 5 in the socket.

The resilient members 300 are embedded in the projecting portions 221, 223 to locate the CPU 53 in the concave 201. Referring to FIGS. 3–4, the resilient member 300 comprises a spring (not shown) and a ball 302 positioned at an end of the spring. The ball 302 is resiliently movable due to the spring. The resilient members 300 cooperate with each other to locate the CPU 53 within the concave 201. A plurality of screws 301 is provided to assist to position the resilient members 300 in the projecting portions 221, 223, thereby to locate CPUs of different sizes.

The pressing portion 402 is received in the through hole 401 of the bulge 22. A plurality of notches 421 is defined at the corners of the through hole 401 to allow the pressing portion 402 to move conveniently. In order to control the moving distance of the pressing portion 402, a pair of springs 423 is set around the connecting posts 422 between the cover 410 and the operation portion 424.

Referring to FIGS. 1–3, in assembling the mounting apparatus, the connecting posts 422 extend through the through holes 411 of the cover 410, with the screw threads thereof received in the screw holes 412 of the pressing portion 402. The cover 410 is attached to the bulge 22 by screws (no labeled). The springs 423 are set around the connecting posts 422, and the pressing portion 424 is fastened to the connecting posts 422 with the screws 427 locked in the screw holes 426 of the connecting posts 422. The resilient members 300 are then embedded in the projecting portions 221, 223 respectively, and the screws 301 position the resilient members in a place where the resilient members 300 can lock the CPU 53 tightly in the concave 201.

Referring also to FIGS. 3–4, in assembly, the CPU 53 is inserted into the concave 201, with Concave upper edges 225 of sidewalls of the CPU 53 sliding along arc surfaces of the balls 302 of the resilient members 360. The balls 302 abut against the sidewalk of the CPU 53 due to the springs in the resilient members 300, so that the CPU 53 is clamped within the concave 201 of the mounting apparatus. When the projecting portions 221,223 of the base 20 arc received in the slots 521, 523 of the socket 52, the CPU 53 is right above and parallel with the socket 52. The pressing portion 424 of the movement unit 40 is depressed to vertically and downwardly move the CPU 53 toward the socket 52, thereby vertically coupling the pads 531 of the CPU 53 to the pins 120 of the socket 52. Simultaneously the CPU 53 leaves the balls 302 of the resilient members 300. The operation portion 424 is easily returned to its original position with the springs 423 retracted. The mounting apparatus is then removed from the socket 52. After the CPU 53 has been inserted into the CPU mounting area of the socket 52, a cover board (not labeled) attached on the socket is pushed down to position the CPU in the socket, and a lever (no labeled) attached on the socket is rotated to fasten the cover board.

To detach the CPU 53, the lever is rotated again to release the cover board, and the mounting apparatus is again inserted in the socket 52 on the motherboard 3 with the CPU 53 clamped by the resilient members 300. The mounting apparatus is drawn out, so that the CPU 53 is vertically removed from the socket 52.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus adapted for mounting a CPU to a socket, the mounting apparatus comprising:
    a base defining a concave therein adapted to accommodate the CPU therein;
    a pair of resilient members disposed at two sides of the Concave, the resilient members being adapted to abut against the CPU, thereby locating the CPU within the concave; and
    a movement unit vertically movably attached to the base, the movement unit comprising a pressing portion to push the CPU to be coupled to the socket,
    wherein a ball is included and resiliently movable in each of the resilient members, and resiliently abuts against a corresponding sidewall of the CPU.

2. The mounting apparatus as described in claim 1, wherein two projecting portions are formed outwardly from the base, and the socket defines two slots for receiving the projecting portions therein.

3. The mounting apparatus as described in claim 1, wherein a connecting post has one end fastened to an upper portion of the pressing portion, a spring is set around the connecting post, and an operating portion is attached at the other end of the connecting post.

4. The mounting apparatus as described in claim 3, wherein a cover is sandwiched between the pressing portion and the spring with the connecting post extending therethrough, the cover is fixed to an upper portion of the base.

5. The mounting apparatus as described in claim 1, wherein a plurality of screws is locked in the base for assisting to position the resilient members.

6. A mounting apparatus adapted for mounting a CPU to a socket in a final position, the mounting apparatus comprising:
    a base adapted to accommodate a CPU therein and expose the CPU from a side thereof;
    at least one resilient member attached to the base for holding releasably the CPU within the base; and
    a pressing portion installed in the base and movable toward the CPU with respect to the base for expelling the CPU from the side of the base toward the final position in the socket,
    wherein at least one projecting portion is formed outwardly from the base, and the socket defines at least one slot for receiving said protecting portion therein.

7. The mounting apparatus as described in claim 6, wherein the pressing portion is movable in a vertical direction with respect to the base in order to expel the CPU.

8. The mounting apparatus as described in claim 6, wherein a ball is resiliently biased in the at least one resilient member.

9. The mounting apparatus as described in claim 8, wherein concave upper edges of sidewalls of the CPU slide along arc surfaces of the balls of the resilient members to facilitate accommodation of the CPU.

10. The mounting apparatus as described in claim 6, wherein a connecting post is fastened to one end of the pressing portion, a spring is set around the connecting post, and an operating portion is attached at the other end of the connecting post.

11. The mounting apparatus as described in claim 10, wherein a cover is sandwiched between the pressing portion and the spring with the connecting post extending therethrough, and the cover is fixed to an upper portion of the base.

12. The mounting apparatus as described in claim 6, wherein the base defined a concave for receiving the CPU therein.

13. The mounting apparatus as described in claim 6, wherein at least one screw is locked in the base to position said resilient member.

14. A method for snugly mounting a CPU to a socket, comprising the steps of;
    providing a base positioned above the socket, the base having a concave defined in a bottom thereof to accommodate the CPU;
    providing a pair of resilient members disposed at each of opposite sides of the concave to clamp the CPU therebetween; providing a pressing portion vertically movably disposed in an upper portion of the base;
    pressing the pressing portion downwardly to snugly couple the CPU to the socket, the CPU released from the resilient members; and
    drawing the base out from the socket,
    wherein two projecting portions are formed outwardly from the base, and the socket defines two slots for receiving the protecting portions therein thereby positioning the base to the socket.

15. The method as described in claim 14, wherein a ball resiliently biased in each of the resilient members for abutting against a corresponding sidewall of the CPU.

* * * * *